US006259592B1

United States Patent
Ono (10) Patent No.: US 6,259,592 B1
(45) Date of Patent: Jul. 10, 2001

(54) APPARATUS FOR RETAINING A WORKPIECE UPON A WORKPIECE SUPPORT AND METHOD OF MANUFACTURING SAME

(75) Inventor: Masanori Ono, Chiba (JP)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/197,321

(22) Filed: Nov. 19, 1998

(51) Int. Cl.$^7$ .................................................. H02N 13/00
(52) U.S. Cl. ............................................ 361/234; 279/128
(58) Field of Search ..................... 361/233–235; 279/128

(56) References Cited

U.S. PATENT DOCUMENTS

| | | | |
|---|---|---|---|
| 4,480,284 | 10/1984 | Tojo et al. | 361/234 |
| 4,551,192 | 11/1985 | Di Milia et al. | 156/345 |
| 4,771,730 | * 9/1988 | Tezuka | 118/723 |
| 4,990,464 | 2/1991 | Baumgart et al. | 437/83 |
| 5,104,834 | 4/1992 | Watanabe et al. | 501/127 |
| 5,117,121 | 5/1992 | Watanabe et al. | 307/130 |
| 5,151,845 | * 9/1992 | Watanabe et al. | 361/234 |
| 5,191,506 | 3/1993 | Logan et al. | 361/234 |
| 5,255,153 | 10/1993 | Nozawa et al. | 361/234 |
| 5,324,053 | 6/1994 | Kubota et al. | 279/128 |
| 5,463,526 | 10/1995 | Mundt | 361/234 |
| 5,486,974 | 1/1996 | Kasahara | 361/234 |
| 5,486,975 | 1/1996 | Shamouilian et al. | 361/234 |
| 5,539,179 | 7/1996 | Nozawa et al. | 219/121.43 |
| 5,583,736 | 12/1996 | Anderson et al. | 361/234 |
| 5,631,803 | 5/1997 | Cameron et al. | 361/234 |
| 5,646,814 | 7/1997 | Shamouilian et al. | 361/234 |
| 5,745,331 | 4/1998 | Shamouilian et al. | 361/234 |
| 5,745,332 | 4/1998 | Burkhart et al. | 361/234 |
| 5,764,471 | 6/1998 | Burkhart | 361/234 |
| 5,777,838 | 7/1998 | Tamagawa et al. | 361/234 |
| 5,909,355 | * 6/1999 | Parkhe | 361/234 |

FOREIGN PATENT DOCUMENTS

| | | | |
|---|---|---|---|
| 63-194345 | 8/1988 | (JP) | H01L/21/68 |
| 7-74233 | 3/1995 | (JP) | H01L/21/68 |

OTHER PUBLICATIONS

Hartsough, Larry D., "Electrostatic Wafer Holding", *Solid State Technology*, pp. 87–90, Jan. 1993.

Singer, Peter, "Electrostatic Chucks in Wafer Processing", *Semiconductor International*, pp. 57–62, Apr. 1995.

* cited by examiner

*Primary Examiner*—Ronald W. Leja
(74) *Attorney, Agent, or Firm*—Thomason, Moser & Patterson, LLP (57) ABSTRACT

Apparatus for retaining a workpiece on a workpiece support and method for manufacturing same. The apparatus contains an adhesive layer, an insulating layer made of a base material having a first resistivity, an electrode layer, a hybrid/adhesive layer and a workpiece support layer made of a base material and a dopant, the dopant having a second resistivity wherein a resistivity of the resultant workpiece support layer is lower than the first resistivity. The multi-resistivity layers establish a Johnsen-Rahbek effect for electrostatic chucking while not unduly compromising chuck strength or longevity. The method consists of the steps of disposing an adhesive layer, disposing an insulating layer, disposing an electrode layer, disposing a hybrid/adhesive layer, disposing a workpiece support layer, curing the layers and forming a plurality of grooves in the workpiece support layer.

23 Claims, 6 Drawing Sheets

APPARATUS FOR RETAINING A WORKPIECE UPON A WORKPIECE SUPPORT AND METHOD OF MANUFACTURING SAME

BACKGROUND OF THE INVENTION

1. Field of the Invention

The invention relates generally to an apparatus for retaining a workpiece within a semiconductor wafer processing system and, more specifically, to an improved composition of a polyimide based electrostatic chuck that maximizes electrostatic clamping ability without loss of material strength or modulus of elasticity.

2. Description of the Background Art

Electrostatic chucks are used for retaining a workpiece in various applications including retaining a semiconductor wafer within a semiconductor wafer process chamber. Although electrostatic chucks vary in design, they all are based on the principle of applying a voltage to one or more electrodes in the chuck so as to induce opposite polarity charges in the workpiece and electrodes, respectively. The electrostatic attractive force between the opposite charges presses the workpiece against the chuck, thereby retaining the workpiece.

Figure 1:
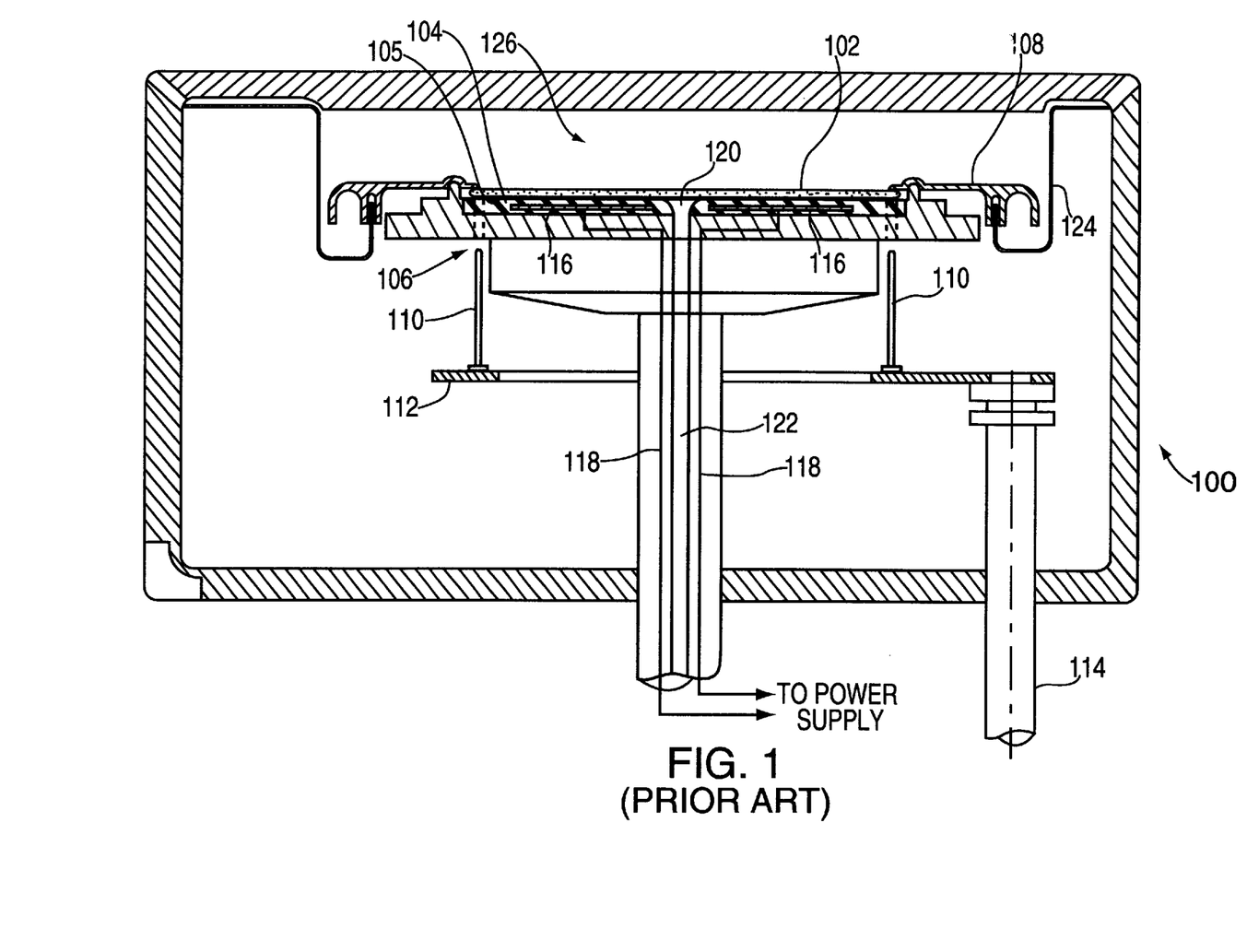
FIG. 1 is a cross-sectional view of a prior art wafer processing chamber.

In semiconductor wafer processing equipment, electrostatic chucks are used for clamping wafers to a pedestal during processing. The pedestal may form an electrode and a heat sink or heater as used in etching, physical vapor deposition (PVD) or chemical vapor deposition (CVD) applications. For example, FIG. 1 depicts a cross-sectional view of a reaction chamber used in semiconductor wafer processing. For a detailed understanding of the reaction chamber and its operation in processing the wafer, the reader should refer to the drawings and the detailed description contained in U.S. Pat. No. 5,228,501, issued Jul. 20, 1993, incorporated herein by reference. That patent teaches a PVD wafer processing chamber manufactured by Applied Materials, Inc. of Santa Clara, Calif. Additionally, the operation of a conventional electrostatic chuck is disclosed in U.S. Pat. No. 5,350,479 issued Sep. 27, 1994 to the assignee hereof, and its disclosure is incorporated herein by reference.

The chamber 100 contains a pedestal 106 supporting an electrostatic chuck 104. The electrostatic chuck 104 has at least one electrode 116 which is insulated from a wafer 102 placed upon an upper surface 105 of the electrostatic chuck 104. Specifically, the electrode 116 is either embedded within the body of the electrostatic chuck 104 or encased in layers of dielectric material which comprise the electrostatic chuck. The electrode(s) 116 are coupled to a power supply (not shown) via electrical conductors 118. The voltage from the power supply creates the electrostatic (or clamping) force which draws the wafer 102 to the chuck 104. Additionally, a variety of components may circumscribe the pedestal 106 to protect the wafer 102 and chamber 100 from improper or excessive deposition, etching or the like. Specifically, a deposition ring 108 contacts the edges of the wafer 102 and a deposition shield 124 circumscribes the deposition ring 108 to define a reaction zone 126. Lift pins 110 are mounted on a platform 112. The platform is coupled to an actuator shaft 114 located below the pedestal 106. The lift pins 110 engage the wafer and lift it off the pedestal 106 after processing is completed.

The mechanism of attraction in the electrostatic chuck used in these types of wafer processing systems is generally Coulombic force. That is, the increase of charges in the insulated electrode 116 induce opposite charges to gather on the backside of the wafer. The resultant force is generally weak per unit area i.e., 15 g/cm$^2$ at 1500V DC because of the composition of the chuck. For example, a commonly used type of dielectric material for fabricating electrostatic chucks is polyimide. Specifically, electrodes are usually sandwiched between two sheets of polyimide to form an electrostatic chuck. Among the beneficial characteristics of polyimide are its high strength and high modulus of elasticity. This material also has high volume resistivity (on the order of $10^{14}$ ohm-cm) and surface resistivity (on the order of $10^{14}$ ohm/cm$^2$). Since the electrode(s) are insulated and a high resistivity dielectric is used, the charges creating the chucking force are not mobile i.e., the electrode and wafer are separated by the dielectric layer. As such, the wafer must come into contact with a large area of the chuck so that an adequate charge accumulation is established for wafer retention.

Additionally, the backside of the wafer 102 and the top surface 105 of the electrostatic chuck 104 are relatively smooth. However, imperfections in each of these surfaces create interstitial spaces when these surfaces come into contact. As such, not all of the wafer is in direct thermal contact with the chuck. Maintaining a uniform temperature across the entire wafer is essential to proper wafer processing. To maintain proper thermal transfer conditions at the wafer during processing, an inert thermal transfer gas is pumped into the interstitial spaces or specially formed grooves in the chuck surface when the clamping force is applied. More specifically, a feed-through pipe 122 in the pedestal 106 provides thermal transfer gas to an aperture 120 in the top surface 105 of the electrostatic chuck 104. The gas, usually Helium or Argon, acts as a thermal conduction medium between the wafer 102 and the chuck 104 that has better thermal transfer characteristics than the vacuum it replaces. To further enhance thermal transfer conditions (i.e., cooling or heating of the wafer), the pedestal temperature is typically controlled using water-cooled conduits within a cooling plate (not shown) below the chuck 104 and/or with resistive heating elements buried in or clamped to the chuck 104. This cooling technique is known as backside gas cooling.

Since the distribution of thermal transfer gas to the interstitial spaces and chuck groove is osmotic and the interstitial spaces may not all be interconnected, some spaces do not receive any gas. This condition can also lead to a non-uniform temperature profile across the backside of the wafer 108 during processing and result in wafer damage. As such, it is advantageous to have as large a gas aperture and groove width as possible to maximize thermal transfer gas flow and pressure beneath the wafer. However, the limited attractive wafer clamping (Coulombic) force establishes a limit on the size of this aperture and the gas pressure therein. Additionally chuck groove width is limited to approximately 1–2 mm. Specifically, if the thermal transfer gas pressure becomes greater than the Coulombic chucking force, the wafer may shift on the pedestal thereby causing a processing anomaly on the wafer. In an extreme situation, the wafer may even pop off the pedestal onto the chamber floor and likely break, rendering the wafer useless. Since effective and uniform heat conduction away from and/or into the wafer is an important aspect of the manufacturing process, different types of chucks are designed in an attempt to maximize clamping force and thermal transfer.

One example of an improved electrostatic chuck is one that employs the Johnsen-Rahbek (J-R) effect. In such a chuck, the dielectric material has an intermediate resistivity instead of a high resistivity. As such, there are mobile charges present in the dielectric material. These mobile charges create a small but effective current flow between the backside of the wafer and the top surface of the electrostatic chuck. Specifically, at points where these two surfaces come into contact, a zero potential exists. These contact points are extremely small in comparison to the total area of a wafer being retained on the chuck. As such, not all of the mobile charges are able to pass through the contact points. The resultant movement and accumulation of the mobile charges within the top surface of the electrostatic chuck and the backside of the wafer creates a very high electrostatic force across the interstitial spaces between the surfaces. This electrostatic force clamps the wafer to the chuck.

Electrostatic chucks using the J-R effect are usually fabricated from a ceramic having an intermediate or "leaky" dielectric characteristic. Materials such as aluminum and silicon oxides and nitrides are popular and well known for use in electrostatic chucks. However, these types of materials must be carefully machined when creating the gas aperture or similar openings grooves or features; otherwise, they may fracture and become unusable. Additionally, the different coefficients of thermal expansion of the wafer and the ceramic may contribute to the phenomenon of "microgrinding" during processing. Microgrinding causes minute contaminant particles from the surface of the electrostatic chuck to become embedded on the backside of the wafer. Such particles may also be released in the process chamber and contaminate succeeding wafers. Polyimide, exhibits none of the undesirable microgrinding or fracturing characteristics of ceramics. Unfortunately, polyimide exhibits only high resistivity characteristics which is not useful in establishing the J-R effect.

Therefore, there is a need in the art for an improved apparatus for retaining a wafer having a strength and modulus of elasticity comparable to polyimide, but have a reduced resistivity level so as to take advantage of the J-R effect for clamping the wafer. Additionally, such an apparatus must be simple and cost-effective in design and construction to allow for optimal thermal transfer gas aperture and groove size in the apparatus and flow of the thermal transfer gas beneath the wafer.

SUMMARY OF THE INVENTION

The disadvantages heretofore associated with the prior art are overcome by an apparatus for retaining a workpiece on a workpiece support having improved clamping force and a relatively high modulus of elasticity. The inventive apparatus contains an insulating layer disposed on a top surface of the workpiece support, the insulating layer having a first resistivity; an electrode layer disposed on top of the insulating layer; and a workpiece support layer disposed on top of the electrode layer, the workpiece support layer having a second resistivity wherein the second resistivity is lower than the first resistivity. A hybrid/adhesive layer having the second resistivity may also be disposed between the electrode layer and the workpiece support layer. With the altered resistivity of the workpiece support layer, a Johnsen-Rahbek effect is established. As such, a workpiece, e.g., a semiconductor wafer, is retained on the workpiece support with a greater force than previously possible, i.e., when using just the workpiece support layer having the first, higher resistivity.

Additionally, a method of manufacturing such an apparatus is disclosed. The method consists of the steps of disposing an insulating layer upon the top surface of a workpiece support; disposing an electrode layer on top of the insulating layer; disposing a doped workpiece support layer on top of the electrode layer and curing the layers. Alternately, an adhesive layer can be disposed between the top surface of the workpiece support and the insulating layer and a hybrid/adhesive layer can be disposed between the electrode layer and the doped workpiece support layer. The described method allows for manufacturing of an electrostatic chuck with a layered polyimide construction that exploits the Johnson-Rahbek effect on its top-most layer to electrostatically retain a workpiece, e.g., a semiconductor wafer, to the workpiece support.

BRIEF DESCRIPTION OF THE FIGURES

The teachings of the present invention can be readily understood by considering the following detailed description in conjunction with the accompanying drawings, in which:

FIGS. 3a through 3i are a step-by-step schematic depiction of the fabrication process of the first embodiment of the inventive apparatus;

FIGS. 4a through 4g are a step-by-step schematic depiction of the fabrication process of the second embodiment of the inventive apparatus;

To facilitate understanding, identical reference numerals have been used, where possible, to designate identical elements that are common to the figures.

DETAILED DESCRIPTION

Figure 2A:
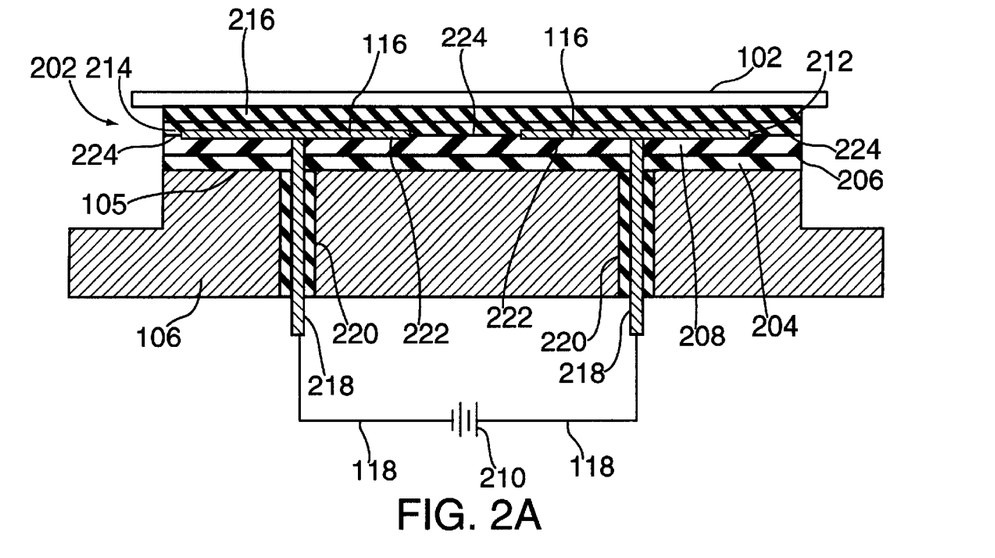
FIG. 2a is a cross-sectional view of a first embodiment of the inventive apparatus.

FIG. 2a depicts a detailed, cross-sectional view of a first embodiment on the inventive electrostatic chuck 202 mounted on a workpiece support 106 (e.g., a pedestal) for supporting a workpiece 102 (e.g., a semiconductor wafer) in a semiconductor wafer processing chamber (e.g., chamber 100 of FIG. 1). More specifically, the electrostatic chuck 202 is a multilayer device that covers the top surface 105 of the pedestal 106. Preferably, the pedestal 106 is fabricated from a durable material (i.e., a metallic substance such as an alloy of aluminum or copper, stainless steel or the like or a ceramic such as aluminum nitride, silicon nitride, silicon dioxide or the like. The electrostatic chuck 202 is affixed to the top surface 105 of the pedestal 106 in stages to form a complete device.

In the first embodiment of the invention, the electrostatic chuck 202 has five layers. The first layer 204 is an adhesive layer. Preferably, the adhesive layer 204 is fabricated from an insulating material such as ordinary polyimide. Polyimide is a widely known and used product in the field of electrostatic chuck manufacturing. The polyimide can be in the form of a thin (e.g., 20–50 μm thick) sheet or is preferably a layer of a paste-like material that can be spread across the top surface 105 to a thickness of approximately 30

μm. The next layer 208 is an insulating layer that is preferably a polyimide film approximately 30–300 μm thick. The insulating layer 208 is applied to a top surface 206 of the adhesive layer 204. The insulating layer 208 forms an electrical barrier between the workpiece support 106 and electrical elements within the electrostatic chuck 202 described below.

The next layer of the electrostatic chuck is an electrode layer 212. The electrode layer 212 contains at least one electrode and, in the depicted bipolar chuck of FIG. 2a, contains a pair of coplanar electrodes 116 disposed on a portion 222 of the insulating layer 208. The electrodes 116 are fabricated from a conductive material (i.e., copper) are approximately 20–300 μm thick and may be in any shape required to maximize chucking force applied to the wafer 102. For example, the electrodes may be in the form of two half-moons, concentric circles, a plurality of individual pads electrically connected by an interconnection trace or the like. The electrode layer 212 is connected to a power source 210 via electrical conductors 118 and electrical feedthroughs 218. The electrical feedthroughs 218 are disposed in insulating conduits 220 within the workpiece support 106. The power source 210 provides the necessary voltage to the electrode layer 212 to clamp the wafer 102 to the pedestal 106. The electrodes 116 may be connected to the power source in any configuration necessary to form the required chucking force. FIG. 2 depicts a bipolar configuration, but this does not preclude the use of other types of configurations including a monopolar configuration.

The next layer of the electrostatic chuck is a hybrid/adhesive layer 214. The hybrid/adhesive layer 214 is disposed over electrode layer 212 and a portion 224 of insulating layer 208 not covered by the electrode layer 212. Preferably, hybrid/adhesive layer 214 is a special semiconducting layer. This semiconducting layer differs in composition and function from the other layers 204 and 208. Specifically, the hybrid/adhesive layer 214 is fabricated from a base material and a dopant. The base material and dopant each have a resistivity that is based on the properties of said material. The resistivity of the base material is greater than the resistivity of the dopant. In a preferred embodiment of the invention, the base material is polyimide and the dopant is carbon. Alternatively, the dopant is a polymer. This doping material increases the conductivity of the polyimide. Thus, it is possible to control the volume and surface resistivity of the chuck by altering the composition of the hybrid/adhesive layer 214 of the chuck. Adding the doping material creates a modified polyimide that is characteristically more conducting than previously possible. That is, more mobile charges are introduced into the polyimide as a result of the doping. As such, the resistivity of the hybrid/adhesive layer is less than the original base material (polyimide). The principle mechanism of attraction in the chuck changes from the weak Coulombic forces to the highly desirable Johnson-Rahbek effect. This hybrid/adhesive layer 214 effectively encapsulates and affixes the electrode layer 212 between layers 208 and 214.

The next and final layer 216 is a workpiece support layer that completes the construction of the inventive electrostatic chuck 202. Preferably, the workpiece support layer 216 is also a semiconducting layer of the same doped polyimide as the hybrid/adhesive layer 214. However, the workpiece support layer 216 is preferably in the form of a doped polymide film approximately 20–300 μm thick and not necessarily a paste. Nonetheless, it contains the same resistivity properties of the hybrid/adhesive layer.

Figure 2B:
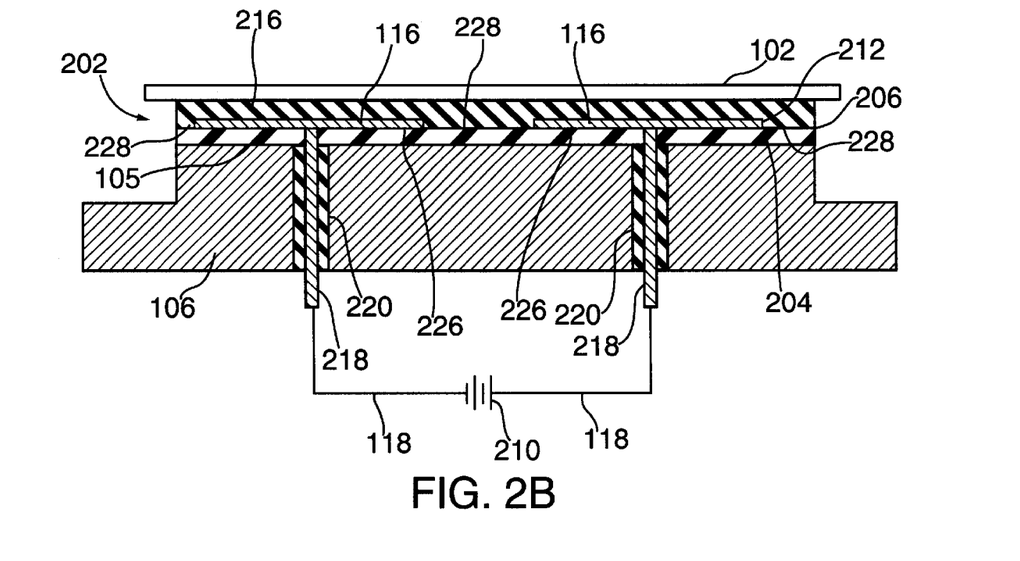
FIG. 2b is a cross-sectional view of a second embodiment of the inventive apparatus.

FIG. 2b depicts an alternate embodiment of the invention wherein the electrostatic chuck 202 is formed of only three layers. In accordance with the previous embodiment, the chuck 202 is affixed to the top surface 105 of a pedestal 106 similar to that shown in FIG. 2a. However, in this embodiment, there are no film layers of either doped or ordinary polyimide. Specifically, a coating of ordinary polyimide paste 204 is applied to the top surface 105 of the pedestal 106 preferably to a thickness of approximately 30–300 μm. In this embodiment, the layer 204 is both an adhesive and insulating layer. Next, an electrode layer 212 identical to the one depicted in FIG. 2a is disposed upon a portion 226 of the polyimide paste layer 204. The electrical connections and feedthroughs are likewise identical to that of FIG. 2a. The third and final layer is the workpiece support layer 216. As discussed in the first embodiment, the workpiece support layer 216 for this embodiment is a coating of doped polyimide paste, preferably applied to a thickness of approximately 20–400 μm over the electrode layer 212 and a portion 228 of the ordinary polyimide paste layer 204 not covered by the electrode layer 212. This workpiece support layer has the same resistivity properties as the hybrid/adhesive layer of the previous embodiment.

Figure 7:
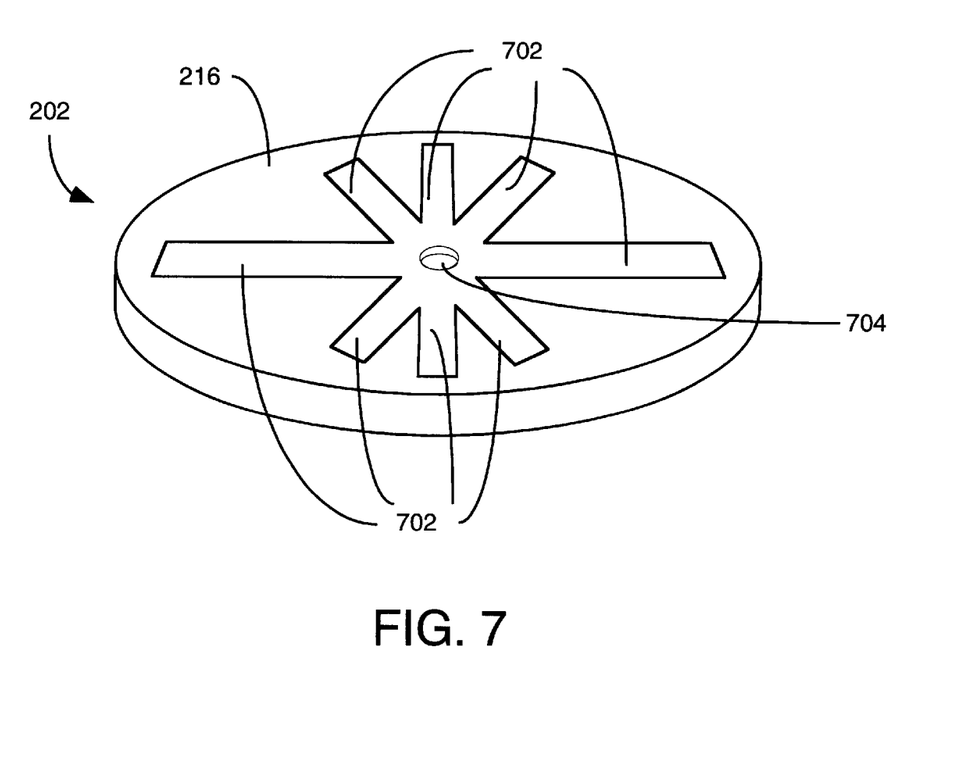
FIG. 7 is a top perspective view of the inventive apparatus.

FIG. 7 depicts a perspective view of the electrostatic chuck 202 without a wafer retained thereon. Specifically, the workpiece support layer 216 is shown in detail. A plurality of grooves 702 are provided in the workpiece support layer 216. The grooves 702 extend radially outward from a center aperture 704 provided in the chuck 202. That is, the center aperture extends through the pedestal 106 (though not specifically shown in FIGS. 2A or 2B) into the chuck 202 to provide a path for a backside gas similar to the port 120 in the prior art apparatus of FIG. 1 and described previously. The backside gas then travels along the grooves 702 to act as a heat transfer medium between the wafer 102 and the chuck 202. In a preferred embodiment of the invention, eight (8) grooves are provided in the workpiece support layer 216.

The gas grooves 702 are formed into layer 216 by any known method for providing surface features in a polyimide-based structure. Such methods include but are not limited to etching or laser cutting after curing (explained in greater detail below). The improved polyimide of the layers above the electrode layer create a chucking force that is approximately 2 times stronger than the chucking force established in conventional electrostatic chucks. As such, wider gas grooves are provided in the subject invention. The width of the gas grooves are approximately two times greater than width of prior art chuck grooves and preferably in the range of approximately 2–4 mm. The wider gas grooves result in a greater volume of backside gas being provided to the wafer. Hence, temperature control of the wafer is also improved.

Figure 3A:
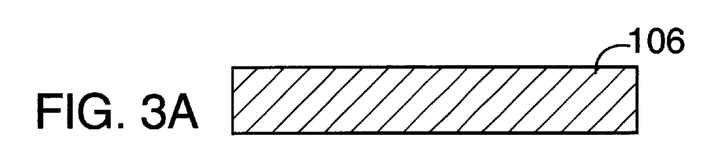
Figures 3B, 3C:
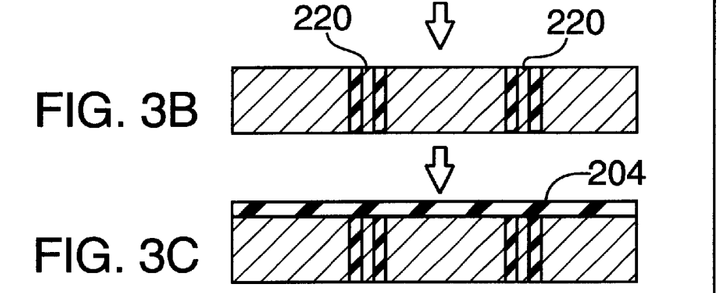
Figure 3D:
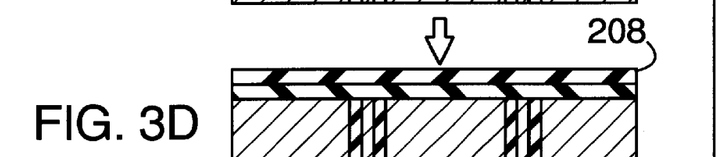

Additionally, a method of manufacture of an improved electrostatic chuck is disclosed. FIGS. 3a–i depict the manufacturing process of the first embodiment of the chuck seen in FIG. 2a in a step-by-step manner as follows. FIG. 3a depicts the first step of the process wherein a bare pedestal 106 is provided. In the next step, depicted in FIG. 3b, one or more insulating conduits 220 are formed in the bare pedestal 106 for providing an insulated path between the electrode layer 212 and the bottom of the pedestal 106. In FIG. 3c, the bare pedestal 106 is coated with an adhesive layer 204. Preferably, the adhesive layer 204 is an ordinary polyimide paste approximately 30 μm thick. The coating process can be performed by any means known in the art of electrostatic chuck manufacturing including screen printing and the like. In Step 3d, an insulating layer 208 is applied over the adhesive layer 204. The insulating layer 208 is preferably an ordinary polyimide film. A preferred thickness of the first insulating layer 208 is approximately 30–300 μm.

Figure 3E:
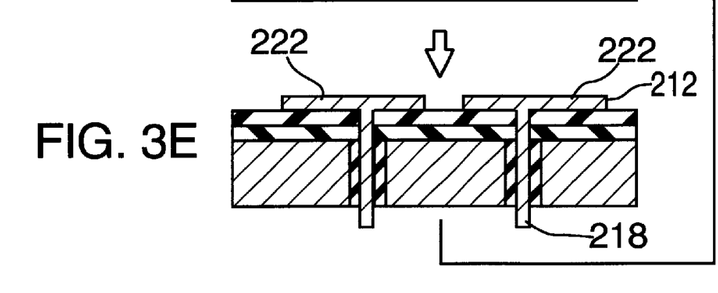
Figures 3F, 3G:
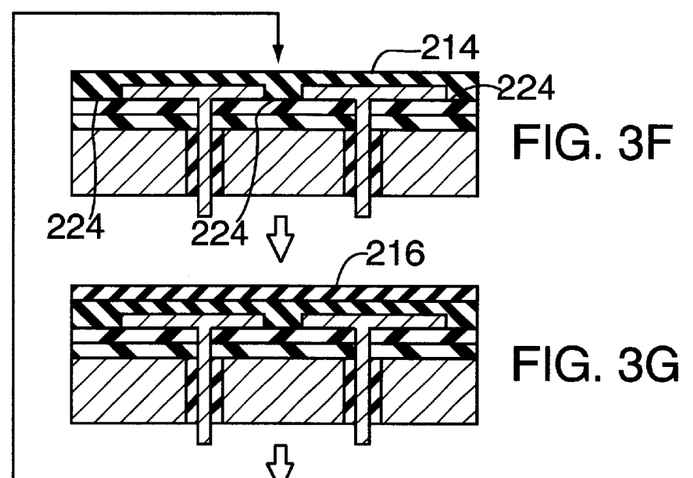
Figure 3H:
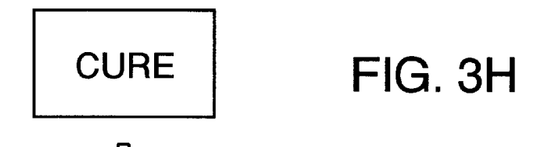
Figure 3I:
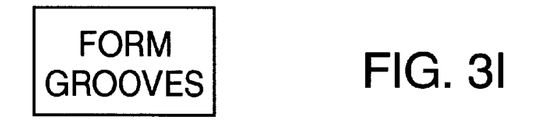

As seen in FIG. 3e, an electrode layer 212 is disposed over a portion 222 of the insulating layer 208 in the next step of electrostatic chuck fabrication method. The electrode layer 212 as described earlier is preferably at least one copper sheet that is applied over the insulating layer 208. One or more electrical feedthroughs 218 extend from the electrodes 116 through the pedestal 106. The feedthroughs are connected to one or more conductors 118 that conduct power from a chucking power supply (not shown) to the electrode layer 212. In the next step, a hybrid/adhesive layer 214 is applied over the electrode layer 212 and a portion 224 of the insulating layer 208 not covered by the electrode layer 212 as seen in FIG. 3f. Preferably, this hybrid/adhesive layer 214 is the doped polyimide paste described earlier and is applied to a thickness of 20–300 $\mu$m. This hybrid/adhesive layer effectively affixes and encapsulates the electrode layer 212 thereby preventing the electrode from contacting any other layers.

FIG. 3g depicts the next step of the electrostatic chuck fabrication process in which a workpiece support layer 216 is disposed over the hybrid/adhesive layer 214. Specifically, a premade sheet of doped polyimide is applied to the hybrid/adhesive layer 214 to form the complete electrostatic chuck 202. In a preferred embodiment of the invention, the workpiece support layer 216 is approximately 20–300 $\mu$m thick. In step 3h, the entire pedestal/chuck assembly 106/202 is placed in a furnace for curing. For example, the assembly is cured at a temperature of approximately 100–350° C. at a pressure of approximately 1 atm for approximately 30 min.–10 hrs. This curing step cures the adhesive and hybrid/adhesive polyimide paste layers 204 and 214 respectively. In step 3i, a plurality of grooves (see in FIG. 7 and described above) are formed in the workpiece support layer 216. The final product is therefore a pedestal 106 with a layered electrostatic chuck 202 on the top surface 105 of the pedestal 106 wherein the top (workpiece support) layer 216 of the chuck 202 is a doped polyimide. The doped layer exhibits a lower resistivity than ordinary polyimide. As such, a greater number of mobile charges exist in the polyimide and which leads to establishment of the Johnson-Rahbek effect. Further, the increased chucking force established by this chuck 202 allows for wider grooves having greater backside gas flow.

Figures 4A, 4B:
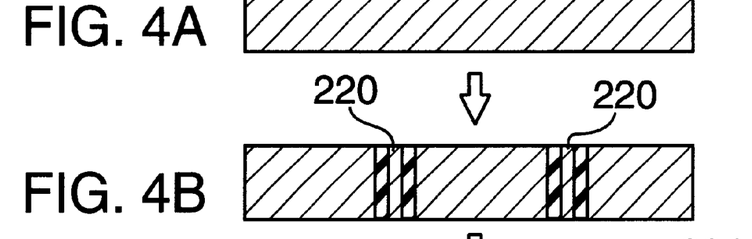
Figure 4C:
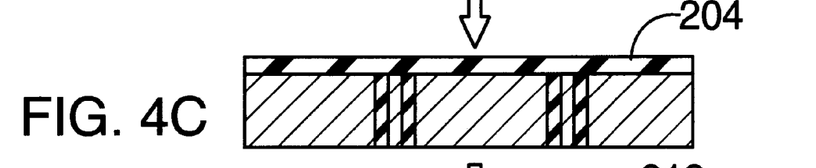
Figure 4D:
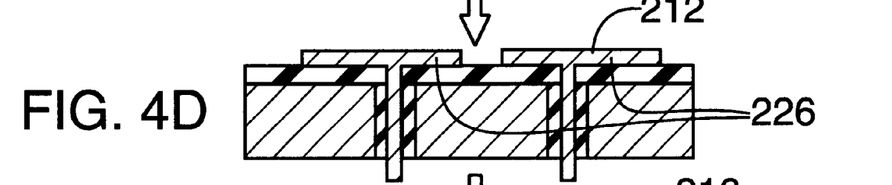
Figure 4E:
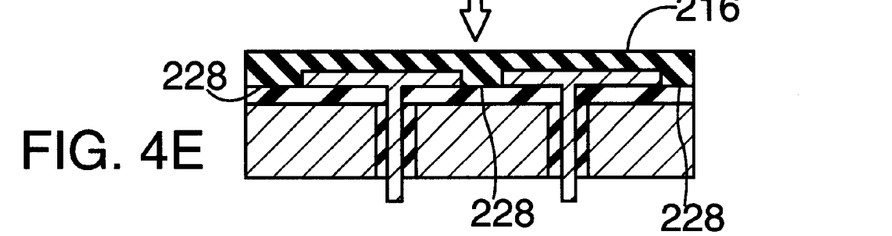

A method of manufacture of the alternate embodiment of the improved electrostatic chuck is also disclosed. FIGS. 4a–g depict the manufacturing process of the alternate embodiment of the chuck seen in FIG. 2b in a step-by-step manner as follows. FIG. 4a depicts the first step of the process wherein a bare pedestal 106 is provided. In the next step, depicted in FIG. 4b, one or more insulating conduits 220 are formed in the bare pedestal 106 for providing an insulated path between the electrode layer 212 and the bottom of the pedestal 106. In FIG. 4c, the bare pedestal 106 is coated with an insulating and adhesive layer 204. Preferably, the insulating and adhesive layer 204 is an ordinary polyimide paste approximately 30–300 $\mu$m thick. The coating process can be performed by any means known in the art of electrostatic chuck manufacturing including screen printing and the like. In Step 4d, an electrode layer 212 is disposed over a portion 226 of the insulating and adhesive layer 204. In step 4e, a workpiece support layer 216 is applied over the electrode layer 212 and a portion 228 of insulating and adhesive layer 204 not covered by the electrode layer 212. Preferably, this workpiece support layer 216 is the doped polyimide paste described earlier and is applied to a thickness of 20–400 $\mu$m. This workpiece support layer 216 effectively affixes and encapsulates the electrode layer 212 thereby preventing the electrode from contacting any other layers and forms a support surface upon which a workpiece (102 of FIG. 2b) is retained.

Figure 4F:
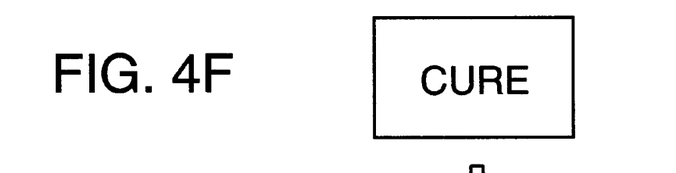
Figure 4G:
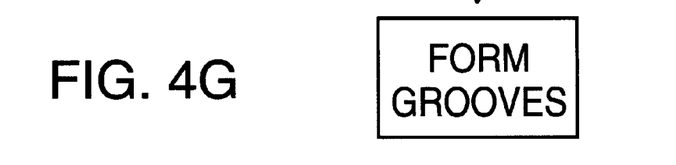

In step 4f, the entire pedestal/chuck assembly 106/202 is placed in a furnace for curing. For example, the assembly is cured at a temperature of approximately 100–350° C. at a pressure of approximately 1 atm for approximately 30 min.–10 hrs. This final curing step cures the insulation and workpiece support paste layers 204 and 216 respectively. In step 4g, a plurality of grooves (see in FIG. 7 and described above) are formed in the workpiece support layer 216.

Figure 5:
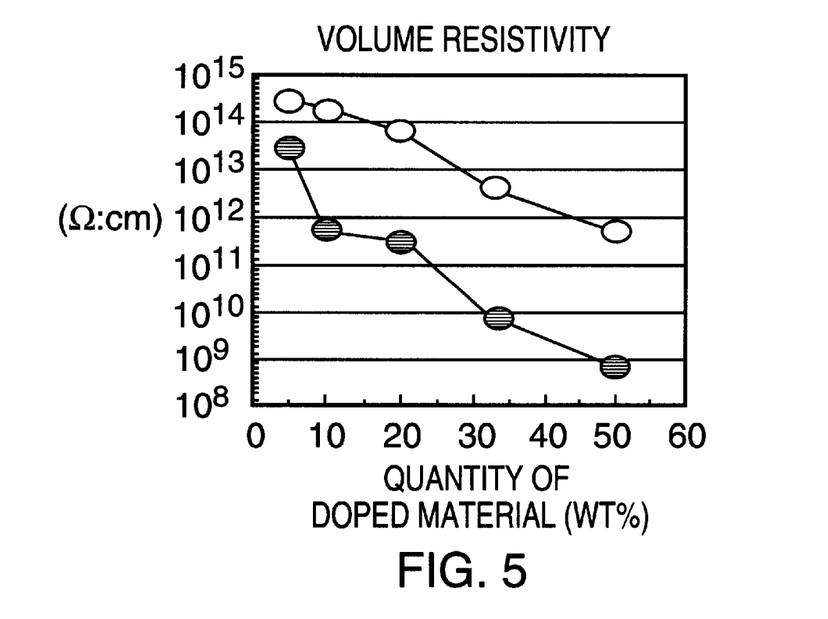
FIG. 5 is a graph of volume resistivity of a material vs. the percentage by weight of a dopant added to the material.
Figure 6:
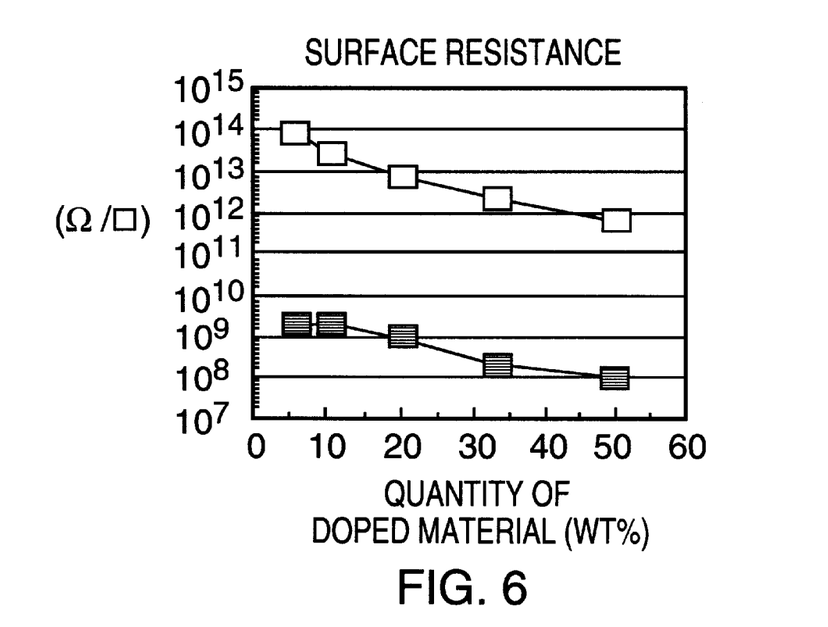
FIG. 6 is a graph of surface resistance of a material vs. the percentage by weight of a dopant added to the material.

Controlling the amount of dopant material is critical to the functionality of the inventive electrostatic chuck. Essentially, the quantity of dopant material must be controlled during the manufacturing of the doped polyimide sheet so as to yield the desired results. Specifically, the ratio of the weight of the dopant material versus the total weight of the improved polyimide is adjusted until the desired volume and surface resistivity are attained. FIG. 5 depicts a graph of volume resistivity vs. percentage by weight of dopant material in the improved polyimide. As a greater amount of dopant material is added to the improved polyimide, the resistivity drops. By increasing the dopant level to 50% by weight of the total improved polyimide, it is possible to reduce the resistivity level by a factor of $10^4$. FIG. 6 depicts a graph of surface resistivity vs. percentage by weight of dopant material in the improved polyimide. Similar reductions in this characteristic are also realized as the dopant level approaches 50% by weight of the total improved polyimide. The dark points on each graph represent post-cured resistivity and the white points represent pre-cured resistivity.

Table 1 displays important dielectric characteristics of ordinary and improved polyimide as the level of dopant material is increased. As seen from this table, there is approximately a 30% drop in the modulus of elasticity, extension and strength of ordinary polyimide as dopant levels are increased through 50% by weight. The reduced levels of these characteristics are not considered to be detrimental to the chuck's longevity.

| Mechanical Characteristics of Improved Polyimide Film | | | |
| --- | --- | --- | --- |
| Quantity of doped material (wt %) | Modulus of elasticity (kgf/mm2) | Extension (%) | Strength (kgf/mm2) |
| Ordinary polyimide 0 | 750 | 18 | 35 |
| Improved polyimide 1 25 | 530 | 16 | 27 |
| Improved polyimide 2 40 | 515 | 13 | 24 |
| Improved polyimide 3 50 | 520 | 10 | 24 |

In sum, the above described method and apparatus provide an electrostatic chuck with altered physical properties of a top layer (i.e., the layer that supports the wafer) of polyimide to establish an improved chucking force to retain a substrate material (i.e., a semiconductor wafer). Specifically, ordinary polyimide is doped to alter the mechanism of attraction from Coulombic force to the Johnsen-Rahbek effect. The resultant device is capable of retaining a wafer with a greater attractive force. As such, a greater thermal transfer gas flow and pressure can be attained under the wafer without the wafer popping off of the chuck due to an inadequate chucking force. The increased thermal transfer gas conditions promote greater temperature control of the wafer and more accurate temperature uniformity during wafer processing.

Although various embodiments which incorporate the teachings of the present invention have been shown and described in detail herein, those skilled in the art can readily devise many other varied embodiments that still incorporate these teachings.

What is claimed is:

1. Apparatus for retaining a workpiece on a workpiece support comprising:

a workpiece support layer disposed on the workpiece support, the workpiece support layer fabricated of a base material and a dopant selected from the group consisting of carbon and a polymer, wherein a resistivity of said workpiece support layer is less than a resistivity of the base material.

2. The apparatus of claim 1 further comprising:

a top surface of the workpiece support;

an insulating layer disposed on the top surface of the workpiece support and an electrode layer disposed on top of the insulating layer wherein the workpiece support layer is disposed on top of the electrode layer.

3. The apparatus of claim 2 further comprising a hybrid/adhesive layer disposed between the electrode layer and the workpiece support layer.

4. The apparatus of claim 3 wherein the hybrid/adhesive layer is fabricated from a base material and a dopant wherein a resistivity of the hybrid/adhesive layer is less than a resistivity of the base material.

5. The apparatus of claim 4 wherein the workpiece support layer and hybrid/adhesive layer base material is polyimide.

6. The apparatus of claim 2 wherein the electrode layer is at least one sheet of copper having a thickness of approximately 20–300 μm.

7. Apparatus for retaining a workpiece on a workpiece support comprising:

a top surface of the workpiece support;

an insulating layer disposed upon the top surface of the workpiece support;

an electrode layer disposed upon the insulating layer;

a hybrid/adhesive layer disposed upon the electrode layer; and a workpiece support layer disposed upon the hybrid/adhesive layer wherein the workpiece support layer and hybrid/adhesive layer are doped variations of the insulating layer, said doped variations doped with material selected from the group consisting of carbon and a polymer.

8. The apparatus of claim 7 wherein the insulating layer is polyimide.

9. The apparatus of claim 7 wherein the hybrid-adhesive layer and workpiece support are doped polymide.

10. The apparatus of claim 7 wherein the workpiece support layer establishes a Johnsen-Rahbek effect.

11. The apparatus of claim 7 wherein an adhesive layer is disposed between the top surface of the workpiece support and the insulating layer.

12. The apparatus of claim 11 wherein the adhesive layer is polyimide.

13. Method for making an apparatus for retaining a workpiece to a workpiece support, the apparatus having a top surface of the workpiece support; an insulating layer; an electrode layer; and a doped workpiece support layer, the method comprising the steps of:

(a) providing the workpiece support;

(b) disposing the insulating layer over the workpiece support;

(c) disposing the electrode layer on a portion of the insulating layer; and (d) disposing the doped workpiece support layer over the electrode layer and a portion of the insulating layer not covered by the electrode layer, said workpiece support layer doped with the material selected from the group consisting of carbon and a polymer;

(e) curing the layers.

14. The method of claim 13 further comprising after step (a) but before step (b), the step of disposing an adhesive layer on the top surface of the workpiece support.

15. The method of claim 14 wherein the step of disposing the adhesive layer on the top surface of the workpiece support further comprises applying a polyimide paste.

16. The method of claim 14 wherein the step of disposing the insulating layer on top of the adhesive layer further comprises applying a polyimide film.

17. The method of claim 14 further comprising after step (a) but before the step of claim 14, forming one or more insulating conduits in the workpiece support.

18. The method of claim 13 wherein the step of disposing the electrode layer on top of the insulating layer further comprises applying a copper sheet.

19. The method of claim 13 further comprising after step (c) but before step (d) the step of disposing a hybrid/adhesive layer on top of the electrode layer.

20. The method of claim 19 wherein the step of disposing the hybrid/adhesive layer on top of the electrode layer further comprises applying a doped polyimide paste.

21. The method of claim 20 wherein the step of disposing the workpiece support layer on top of the hybrid/adhesive layer further comprises applying a doped polyimide film.

22. The method of claim 13 wherein the step of curing the layers further comprises placing the workpiece support with the disposed layers in a furnace for approximately 30 min.–10 hrs. at approximately 100° C.–350° C.

23. The method of claim 13 further comprising after step (e), forming a plurality of grooves in the workpiece support layer.

* * * * *